(12) United States Patent
Fujii

(10) Patent No.: US 8,786,099 B2
(45) Date of Patent: Jul. 22, 2014

(54) WIRING SUBSTRATE AND SEMICONDUCTOR PACKAGE

(75) Inventor: Tomoharu Fujii, Nagano (JP)

(73) Assignee: Shinko Electric Industries Co., Ltd., Nagano-Shi (JP)

(*) Notice: Subject to any disclaimer, the term of this patent is extended or adjusted under 35 U.S.C. 154(b) by 0 days.

(21) Appl. No.: 13/593,752

(22) Filed: Aug. 24, 2012

(65) Prior Publication Data
US 2013/0062754 A1    Mar. 14, 2013

(30) Foreign Application Priority Data
Sep. 12, 2011    (JP) .................................. 2011-198280

(51) Int. Cl.
H01L 23/52    (2006.01)
H01L 23/538    (2006.01)

(52) U.S. Cl.
CPC ....... H01L 23/5386 (2013.01); H01L 2225/107 (2013.01); H05K 2201/10378 (2013.01)
USPC ........... 257/774; 257/773; 257/692; 257/693; 257/698; 257/E23.026; 257/E23.145; 257/E23.152; 257/E23.174; 257/E23.175

(58) Field of Classification Search
CPC ............ H01L 2224/06051; H01L 2224/14051
See application file for complete search history.

(56) References Cited

U.S. PATENT DOCUMENTS

| 7,405,473 B1* | 7/2008 | Shi et al. ................. 257/698 |
| 2006/0118965 A1* | 6/2006 | Matsui .................. 257/774 |
| 2010/0078207 A1* | 4/2010 | Chang et al. .............. 174/261 |

FOREIGN PATENT DOCUMENTS

JP    2001-148448    5/2001

* cited by examiner

Primary Examiner — Julio J Maldonado
Assistant Examiner — Molly Reida
(74) Attorney, Agent, or Firm — Rankin, Hill & Clark LLP

(57) ABSTRACT

A wiring substrate includes: a substrate body made of an inorganic material; a first electrode portion, having a rectangular plane shape, which penetrates through the substrate body in a thickness direction of the substrate body; a second electrode portion, having a rectangular plane shape, which penetrates through the substrate body in the thickness direction and faces the first electrode portion at a prescribed interval; and a signal electrode, which is provided between the first electrode portion and the second electrode portion and penetrates through the substrate body in the thickness direction, wherein one of the first electrode portion and the second electrode portion is a ground electrode and the other is a power electrode.

5 Claims, 8 Drawing Sheets

US 8,786,099 B2

WIRING SUBSTRATE AND SEMICONDUCTOR PACKAGE

BACKGROUND

1. Field of the Invention

The present invention relates to a wiring substrate made of an inorganic material and a semiconductor package in which a semiconductor chip is mounted on the wiring substrate.

2. Description of the Related Art

Wiring substrates made of organic materials such as insulative resins and wiring substrates made of inorganic materials such as silicon are known. In wiring substrates made of organic materials, a planar power plane and ground (GND) plane are formed to attain impedance matching, reduction of power source impedance, etc., as disclosed in JP-A-2001-148448.

The resistance of a power pattern or a ground pattern can be made low by making the area of a power plane or a GND plane as wide as possible. When opposed to each other at a small interval, a power plane and a GND plane can be made more capacitive than inductive. Furthermore, impedance matching can be attained by interposing a signal electrode between a power plane and a GND plane.

On the other hand, in wiring substrates made of inorganic materials, because of a microloading effect etc., it is difficult to form a planar power plane or GND plane. Therefore, a power line and a GND line are each formed merely by very fine wiring patterns and a via line.

Besides, the microloading effect is a phenomenon that the etching rate varies depending on the aspect ratio (i.e., the ratio between the width and the depth) of a pattern.

However, if a power line and a GND line are each formed merely by very fine wiring patterns and a via line in a wiring substrate made of an inorganic material, layers having wide conductor areas cannot be secured, as a result of which the power line and the GND line are made large in resistance and become more capacitive than inductive. As a result, power source impedance is made high. Furthermore, impedance matching with a line for high-speed input/output signals cannot be attained.

Even if the structure disclosed in JP-A-2001-148448 is employed, it is not easy to attain impedance matching though low power source impedance can be attained.

SUMMARY

The present invention has been made in view of the above, and an object of the invention is therefore to provide a wiring substrate which can attain low power source impedance and impedance matching easily though made of an inorganic material, as well as a semiconductor package in which a semiconductor chip is mounted on such a wiring substrate.

A wiring substrate according to the invention includes: a substrate body made of an inorganic material; a first electrode portion, having a rectangular plane shape, which penetrates through the substrate body in a thickness direction of the substrate body; a second electrode portion, having a rectangular plane shape, which penetrates through the substrate body in the thickness direction and faces the first electrode portion at a prescribed interval; and a signal electrode, which is provided between the first electrode portion and the second electrode portion and penetrates through the substrate body in the thickness direction, wherein one of the first electrode portion and the second electrode portion is a ground electrode and the other is a power electrode. The first electrode portion may include a plurality of first electrodes, the second electrode portion may include a plurality of second electrodes, and the first electrodes and the second electrodes may be arranged alternately at prescribed intervals in each of a first direction and a second direction which are perpendicular to each other.

The above-disclosed technique makes it possible to provide a wiring substrate which can attain low power source impedance and impedance matching easily though made of an inorganic material, as well as a semiconductor package in which a semiconductor chip is mounted on such a wiring substrate.

BRIEF DESCRIPTION OF THE DRAWINGS

The present invention will become more fully understood from the detailed description given hereinbelow and the accompanying drawing which is given by way of illustration only, and thus is not limitative of the present invention and wherein.

DETAILED DESCRIPTION OF THE INVENTION

Figure 1:
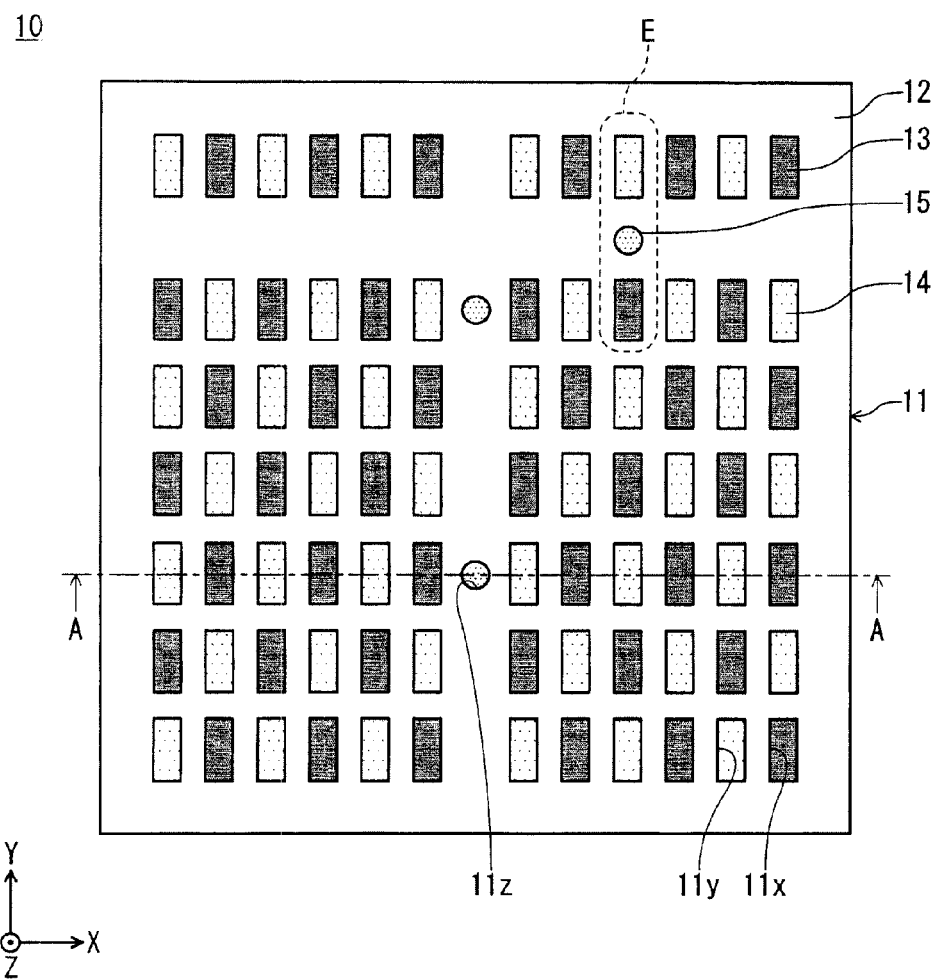
FIG. 1 is a plan view of a wiring substrate according to an embodiment.

Modes for carrying out the invention will be hereinafter described with reference to the drawings. The same constituent elements are given the same reference symbol in the drawings, and may not be described redundantly.

Figure 2:
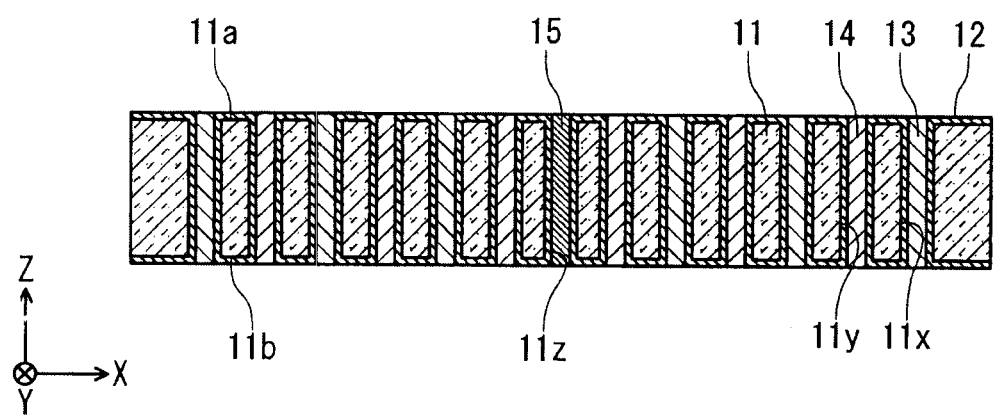
FIG. 2 is a sectional view taken along line A-A in FIG. 1.

First, the configuration of a wiring substrate 10 according to an embodiment will be described. FIG. 1 is a plan view of the wiring substrate 10 according to the embodiment. FIG. 2 is a sectional view taken along line A-A in FIG. 1.

As shown in FIGS. 1 and 2, the wiring substrate 10 has a substrate body 11, an insulating film 12, ground (GND) electrodes 13 (first electrodes), power electrodes 14 (second electrodes), and signal electrodes 15. Although the shape of the wiring substrate 10 is arbitrary, the embodiment will be directed to a case that the wiring substrate 10 has a plate-like shape that is square in a plan view. The X direction (first direction) is defined as the direction of two confronting sides of the square top surface of the wiring substrate 10, and the Y direction (second direction) is defined as the direction that is perpendicular to the X direction in the square top surface. The Z direction is defined as the thickness direction of the wiring substrate 10.

In the wiring substrate 10, through-holes 11$x$, 11$y$, and 11$z$ are formed through the substrate body 11 which is a base member in which the GND electrodes 13 etc. are formed. For example, the substrate body 11 measures 2 to 3 mm in each of the X direction and the Y direction and about 200 to 300 µm in the thickness direction (Z direction). For example, the material of the substrate body 11 is an inorganic material such as silicon, glass, or ceramics.

A semiconductor package can be formed by mounting a semiconductor chip on the wiring substrate 10. In this case, since in many cases the semiconductor chip has a silicon substrate, for matching between thermal expansion coefficients, it is preferable to use, as the material of the substrate body 11, silicon or borosilicate glass which is close to silicon in the thermal expansion coefficient. Borosilicate glass is glass whose main components are boron oxide ($B_2O_3$) and silica ($SiO_2$), and has a thermal expansion coefficient of about 3 ppm/° C.

The reason why the thermal expansion coefficient of the substrate body 11 needs to be matched with that of the semiconductor chip is to reduce thermal stress that may occur in the joining portions of the wiring substrate 10 and the semiconductor chip in view of the probability that the semiconductor chip may be caused to operate in a high-temperature or low-temperature atmosphere. The following description will be directed to a case that the substrate body 11 is made of silicon.

The through-holes 11x, 11y, and 11z penetrate through the substrate body 11 from its one surface 11a to the other surface 11b. The through-holes 11x are formed for formation of the GND electrodes 13 so as to extend in the thickness direction (Z direction) of the substrate body 11. The through-holes 11y are formed for formation of the power electrodes 14 so as to extend in the thickness direction (Z direction) of the substrate body 11. The through-holes 11x and the through-holes 11y are arranged alternately at prescribed intervals in each of the X direction and the Y direction. It is not necessary that all the intervals between the through-holes 11x and the through-holes 11y be identical.

For example, each of the through-holes 11x and the through-holes 11y has a rectangular plane shape (including a square one). For example, the width (in the X direction) of each of the through-holes 11x and the through-holes 11y is set at several tens to several hundreds of micrometers. For example, the length (in the Y direction) of each of the through-holes 11x and the through-holes 11y is also set at several tens to several hundreds of micrometers. For example, the interval between through-holes 11x and 11y that are adjacent to each other in the X direction is set at several tens to several hundreds of micrometers. For example, the interval between through-holes 11x and 11y that are adjacent to each other in the Y direction is also set at several tens to several hundreds of micrometers.

The plane shape of each of the through-holes 11x and the through-holes 11y is not required to be a rectangle in a strict sense, and may be a rectangle substantially within the confines that advantages of the embodiment are not impaired. For example, the corner portions of each of the through-holes 11x and the through-holes 11y may be rounded.

The through-holes 11z are formed for formation of the signal electrodes 15 so as to extend in the thickness direction (Z direction) of the substrate body 11. For example, the through-holes 11z are circular in a plan view, in which case their diameter is set at about 50 to 100 μm, for example. Each through-hole 11z is formed at such position as to be interposed between through-holes 11x and 11y. Alternatively, the through-holes 11z may be rectangular, for example, in a plan view.

The insulating film 12 is formed on the surfaces 11a and 11b of the substrate body 11 and the inner side surfaces of the through-holes 11x, 11y, and 11z. The insulating film 12 insulates the substrate body 11 from the GND electrodes 14, the power electrodes 14, and the signal electrodes 15. For example, the material of the insulating film 12 is silicon dioxide ($SiO_2$), silicon nitride (SiN), or polyimide (PI). For example, the thickness of the insulating film 12 is set at about 1 to 2 μm.

Although in the embodiment the insulating film 12 is used because the substrate body 11 is made of silicon which is a semiconductor material, the insulating film 12 may be omitted if the substrate body 11 is made of an insulative material such as glass or ceramics.

The GND electrodes 13 are formed so that the respective through-hole 11x (whose inner side surfaces are covered with the insulating film 12) are filled with them. The GND electrodes 13 are to be electrically connected to the ground (GND) of a semiconductor chip or the like. The surfaces, exposed on the side of the one surface 11a of the substrate body 11, of the GND electrodes 13 are approximately flush with the surface of that portion of the insulating film 12 which covers the surface 11a. The surfaces, exposed on the side of the other surface 11b of the substrate body 11, of the GND electrodes 13 are approximately flush with the surface of that portion of the insulating film 12 which covers the surface 11b. For example, the material of the GND electrodes 13 is a metal material containing copper (Cu) as the main component.

The power electrodes 14 are formed so that the through-holes 11y (whose inner side surfaces are covered with the insulating film 12) are filled with them. The power electrodes 14 are to be electrically connected to a power line of a semiconductor chip or the like. The surfaces, exposed on the side of the one surface 11a of the substrate body 11, of the power electrodes 14 are approximately flush with the surface of that portion of the insulating film 12 which covers the surface 11a. The surfaces, exposed on the side of the other surface 11b of the substrate body 11, of the power electrodes 14 are approximately flush with the surface of that portion of the insulating film 12 which covers the surface 11b. For example, the material of the power electrodes 14 is a metal material containing copper (Cu) as the main component.

The GND electrodes 13 and the power electrodes 14 are arranged alternately at prescribed intervals in each of the X direction and the Y direction. For example, like each of the through-holes 11x and the through-holes 11y, each of the GND electrodes 13 and the power electrodes 14 has a rectangular plane shape. For example, the width (in the X direction) of each of the GND electrodes 13 and the power electrodes 14 is set at several tens to several hundreds of micrometers. For example, the length (in the Y direction) of each of the GND electrodes 13 and the power electrodes 14 is also set at several tens to several hundreds of micrometers. For example, the interval between a GND electrode 13 and a power electrode 14 that are adjacent to each other in the X direction is set at several tens to several hundreds of micrometers. For example, the interval between a GND electrode 13 and a power electrode 14 that are adjacent to each other in the Y direction is also set at several tens to several hundreds of micrometers.

The signal electrodes 15 are formed so that the through-holes 11z (whose inner side surfaces are covered with the insulating film 12) are filled with them. The signal electrodes 15 are to be electrically connected to signal electrodes of a semiconductor chip or the like. The surfaces, exposed on the side of the surface 11a of the substrate body 11, of the respective signal electrodes 15 are approximately flush with the surface of that portion of the insulating film 12 which covers the surface 11a. The surfaces, exposed on the side of the surface 11b of the substrate body 11, of the respective signal electrodes 15 are approximately flush with the surface of that portion of the insulating film 12 which covers the surface 11b.

For example, the material of the signal electrodes 15 is a metal material containing copper (Cu) as the main component. For example, like the through-holes 11z, the signal electrodes 15 are circular in a plan view, in which case their diameter is set at about 50 to 100 μm, for example.

As seen from, for example, a region E shown in FIG. 1, each signal electrode 15 is interposed between a GND electrode 13 and a power electrode 14 which are opposed to each other at a prescribed interval. Since each signal electrode 15 is interposed between a GND electrode 13 and a power electrode 14 each of which has a rectangular plane shape, a transmission line having what is called a coplanar structure is realized and hence impedance matching can be attained (e.g., impedance of 50Ω can be realized).

As described above, in the wiring substrate 10 according to the embodiment, the GND electrodes 13 and the power electrodes 14 which are formed so as to extend in the thickness direction of the substrate body 11 are arranged alternately at prescribed intervals in each of the X direction and the Y direction. Each signal electrode 15 which is formed so as to extend in the thickness direction of the substrate body 11 is disposed at such a position as to be interposed between a GND electrode 13 and a power electrode 14. The numbers of GND electrodes 13, power electrodes 14, and signal electrodes 15 may be determined as appropriate.

[Manufacturing Method of Wiring Substrate According to Embodiment]

Next, a manufacturing method of the wiring substrate 10 according to embodiment will be described. FIGS. 3-6 are sectional views illustrating a manufacturing process of the wiring substrate 10 according to embodiment.

Figure 3:
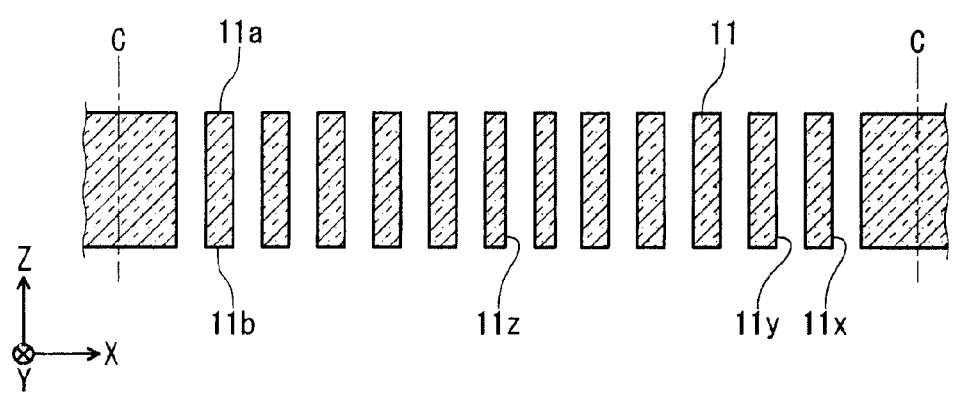
FIG. 3 is a first sectional view illustrating a manufacturing process of the wiring substrate according to the embodiment.

First, in the step shown in FIG. 3, a substrate body 11 is prepared and through-holes 11x, 11y, and 11z are formed through the substrate body 11 so as to reach its surfaces 11a and 11b. For example, the substrate body 11 is a silicon wafer of 6 inches (about 150 mm), 8 inches (about 200 mm), or 12 inches (about 300 mm). For example, the thickness of the silicon wafer is 0.625 (in the case of 6 inches), 0.725 mm (in the case of 8 inches), or 0.775 mm (in the case of 12 inches). However, the silicon wafer may be thinned as appropriate using a backside grinder or the like (e.g., to a thickness of about 200 to 300 μm). Reference character C indicates positions where the substrate body 11 etc. are cut finally (hereinafter referred to as "cutting positions C").

As shown in FIG. 1, the through-holes 11x and the through-holes 11y are arranged alternately at prescribed intervals in each of the X direction and the Y direction. The through-holes 11z are arranged in such a manner that each of them is disposed between a through-holes 11x and 11y that are opposed to each other at a prescribed interval.

For example, the through-holes 11x, 11y, and 11z are formed by forming, on the one surface 11a of the substrate body 11, a resist layer having openings in regions where the through-holes 11x, 11y, and 11z are to be formed and etching the substrate body 11 using the resist layer as a mask. It is preferable to use an anisotropic etching method such as deep reactive ion etching (DRIE) that uses $SF_6$ (sulfur hexafluoride).

For example, each of the through-holes 11x and the through-holes 11y has a rectangular plane shape. For example, the width (in the X direction) of each of the through-holes 11x and the through-holes 11y is set at several tens to several hundreds of micrometers. For example, the length (in the Y direction) of each of the through-holes 11x and the through-holes 11y is also set at several tens to several hundreds of micrometers. For example, the interval between through-holes 11x and 11y that are adjacent to each other in the X direction is set at several tens to several hundreds of micrometers. For example, the interval between through-holes 11x and 11y that are adjacent to each other in the Y direction is also set at several tens to several hundreds of micrometers.

For example, the through-holes 11z are formed so as to be circular in a plan view, in which case their diameter is set at about 50 to 100 μm, for example. Each through-hole 11z is formed at such a position as to be interposed between through-holes 11x and 11y. Alternatively, the through-holes 11z may be formed so as to be rectangular, for example, in a plan view.

Figure 4:
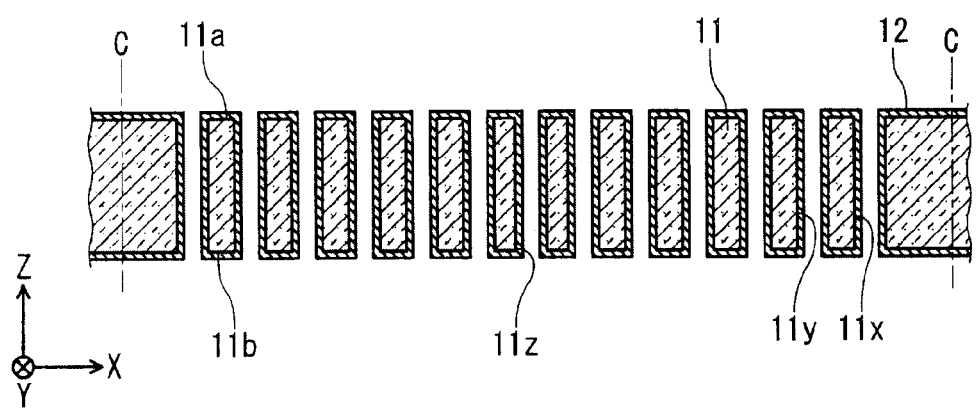
FIG. 4 is a second sectional view illustrating the manufacturing process of the wiring substrate according to the embodiment.

Then, in the step shown in FIG. 4, an insulating film 12 is formed on the surfaces 11a and 11b of the substrate body 11 and the inner side surfaces of the through-holes 11x, 11y, and 11z. For example, the insulating film 12 is a thermal oxidation film ($SiO_2$ film). The insulating film 12 is formed through thermal oxidation by a wet thermal oxidation method in which the temperature of the surface and its vicinity of the substrate body 11 is increased to, for example, 1,000° C. or higher. For example, the thickness of the insulating film 12 is set at about 1 to 2 μm. Alternatively, a film made of silicon dioxide ($SiO_2$), silicon nitride (SiN), polyimide (PI), or the like may be formed as the insulating film 12 by CVD (chemical vapor deposition), for example.

Figure 5:
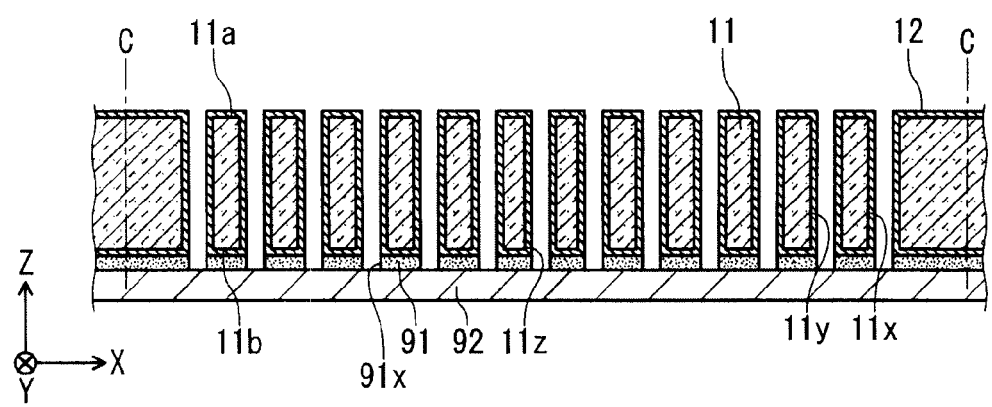
FIG. 5 is a third sectional view illustrating the manufacturing process of the wiring substrate according to the embodiment.

Then, in the step shown in FIG. 5, a metal layer 92 is placed, via a bonding layer 91, on that portion of the insulating film 12 which covers the other surface 11b of the substrate body 11. Then, openings 91x are formed through the bonding layer 91 by removing its portions exposed by the through-holes 11x, 11y, and 11z whose inner side surfaces are covered with the insulating film 12, by asking, for example.

As a result, surface portions of the metal film 92 are exposed by the through-holes 11x, 11y, and 11z whose inner side surfaces are covered with the insulating film 12. The metal film 92 is a member to serve as an electricity supply layer in forming GND electrodes 13, power electrodes 14, and signal electrodes 15 by electrolytic plating. For example, the metal film 92 is a copper (Cu) plate or foil. The following description will be directed to a case that the metal film 92 is a copper plate.

Figure 6:
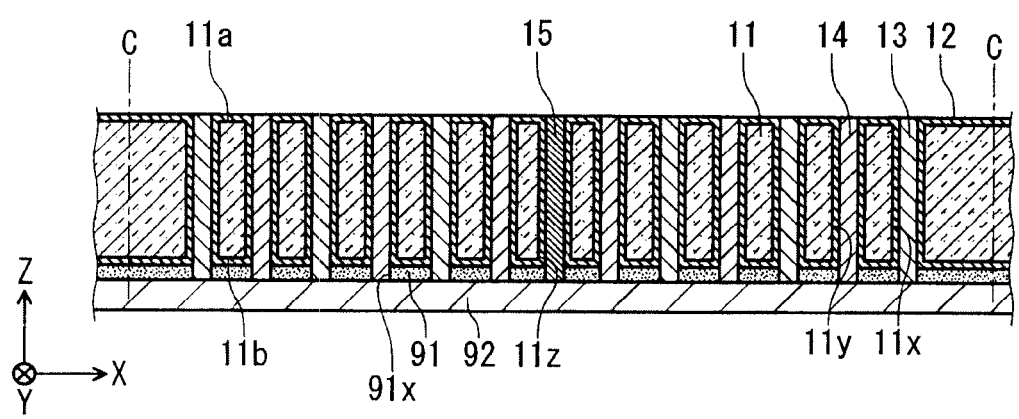
FIG. 6 is a fourth sectional view illustrating the manufacturing process of the wiring substrate according to the embodiment.

Next, in the step shown in FIG. 6, plating films are deposited and grown in the through-holes 11x, 11y, and 11z from the side of the metal layer 92 by electrolytic plating in which the metal layer 92 serves as an electricity supply layer. GND electrodes 13, power electrodes 14, and signal electrodes 15 are formed so that the through-holes 11x, 11y, and 11z (whose inner side surfaces are covered with the insulating film 12) are filled with them, respectively. For example, a metal material containing copper (Cu) as the main component is used as a material of the GND electrodes 13, the power electrodes 14, and the signal electrodes 15.

For example, like each of the through-holes 11x and the through-holes 11y, each of the GND electrodes 13 and the power electrodes 14 is formed so as to have a rectangular plane shape. For example, the width (in the X direction) of each of the GND electrodes 13 and the power electrodes 14 is set at several tens to several hundreds of micrometers. For example, the length (in the Y direction) of each of the GND electrodes 13 and the power electrodes 14 is also set at several tens to several hundreds of micrometers.

For example, the interval between a GND electrode 13 and a power electrode 14 that are adjacent to each other in the X direction is set at several tens to several hundreds of micrometers. For example, the interval between a GND electrode 13 and a power electrode 14 that are adjacent to each other in the Y direction is also set at several tens to several hundreds of micrometers. For example, like the through-holes 11z, the signal electrodes 15 are formed so as to be circular in a plan view, in which case their diameter is set at about 50 to 100 µm, for example.

If necessary, the substrate body 11 may be planarized by polishing it on the side of the one surface 11a by CMP (chemical mechanical polishing), for example. As a result, those surfaces of the GND electrodes 13, the power electrodes 14, and the signal electrodes 15 which are exposed on the side of the surface 11a of the substrate body 11 can be made approximately flush with that surface of the insulating film 12 which covers the surface 11a of the substrate body 11.

Then, although not shown in any drawing, after the step shown in FIG. 6, the bonding layer 91 and the metal layer 92 are removed and those portions of the GND electrodes 13, the power electrodes 14, and the signal electrodes 15 which project from the other surface 11b of the substrate body 11 are polished away by CMP, for example. As a result, those surfaces of the GND electrodes 13, the power electrodes 14, and the signal electrodes 15 which are exposed on the side of the surface 11b of the substrate body 11 can be made approximately flush with the surface of the insulating film 12 which covers the surface 11b of the substrate body 11. Then, the thus-produced structure is cut into individual substrates at the cutting positions C by dicing, for example, whereby wiring substrates 10 as shown in FIGS. 1 and 2 are completed.

The metal layer 92 which is a copper (Cu) plate can be removed by wet etching which uses an aqueous solution of ferric chloride, cupric chloride, ammonium persulfate, or the like. The bonding layer 91 can be removed by asking, for example.

As described above, in the wiring substrate 10 according to the embodiment, the GND electrodes 13 which are formed so as to extend in the thickness direction of the substrate body 11 and the power electrodes 14 which are formed so as to extend in the thickness direction of the substrate body 11 are arranged alternately at prescribed intervals in each of the X direction and the Y direction. Each signal electrode 15 which is formed so as to extend in the thickness direction of the substrate body 11 is disposed at such a position as to be interposed between a GND electrode 13 and a power electrode 14.

Since the GND electrodes 13 and the power electrodes 14 are formed so as to extend in the thickness direction of the substrate body 11, wide conductor areas can be secured and many GND electrodes 13 and the power electrodes 14 can be formed. The resistance of each of the GND electrodes 13 and the power electrodes 14 can thus be made low. Since the GND electrodes 13 and the power electrodes 14 are opposed to each other at a small interval, they can be made more capacitive than inductive. Furthermore, such GND electrodes 13 and power electrodes 14 can reduce power source impedance in the wiring substrate 10. In particular, since each of the GND electrodes 13 and the power electrodes 14 has a rectangular plane shape and the GND electrodes 13 and the power electrodes 14 are opposed to each other, they can easily be made highly capacitive.

If each of the GND electrodes 13 and the power electrodes 14 had a circular plane shape, they would be less capacitive because the distance between a GND electrode and a power electrode varies depending on the position. In contrast, in the embodiment, since each of the GND electrodes 13 and the power electrodes 14 has a rectangular plane shape, the distance between a GND electrode 13 and a power electrode 14 is constant and hence the GND electrodes 13 and the power electrodes 14 can be made highly capacitive.

Since each signal electrode 15 which is formed so as to extend in the thickness direction of the substrate body 11 is disposed at such a position as to be interposed between a GND electrode 13 and a power electrode 14 which are formed so as to extend in the thickness direction of the substrate body 11, reduction of power source impedance in the wiring substrate 10 and other advantages can be realized without lowering the wiring density in the wiring substrate 10.

Since each signal electrode 15 is interposed between a GND electrode 13 and a power electrode 14, it can be shielded from external noise. And each signal electrode 15 itself can be prevented from becoming a noise source.

Furthermore, since each signal electrode 15 is interposed between a GND electrode 13 and a power electrode 14 which are opposed to each other at a prescribed interval, a transmission line having what is called a coplanar structure is realized and hence impedance matching can be attained (e.g., impedance of 50Ω can be realized).

<Modification 1 of Embodiment>

In a first modification of the embodiment, insulating layers and a wiring layer are provided on both surfaces of the substrate body. In the first modification of the embodiment, constituent elements having the same ones in the embodiment will not be described in detail.

Figure 7:
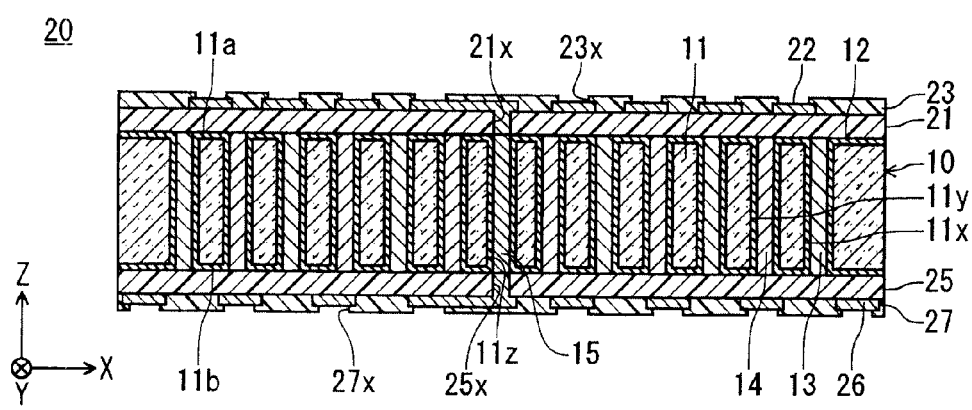
FIG. 7 is a sectional view of a wiring substrate according to a first modification of the embodiment.

FIG. 7 is a sectional view of a wiring substrate 20 according to the first modification of the embodiment. As shown in FIG. 7, the wiring substrate 20 is configured in such a manner that insulating layers and a wiring layer are provided on both surfaces of the substrate body 11 in the wiring substrate 10 according to the embodiment.

In the wiring substrate 20, an insulating layer 21 is formed on the one surface 11a of the substrate body 11 via the portion of the insulating film 12. For example, the material of the insulating layer 21 is an epoxy or polyimide insulative resin. For example, the thickness of the insulating layer 21 is set at about 15 to 25 µm.

A wiring layer 22 (what is called a re-wiring layer) is formed on the insulating layer 21. The wiring layer 22 includes via lines with which respective via holes 21x are filled which penetrate through the insulating layer 21 and expose the one end faces of the respective signal electrodes 15 and wiring patterns formed on the insulating layer 21. The wiring patterns are patterned so as to have prescribed plane shapes. The via holes 21x are through holes that are open on both of the insulating layer 23 side and the substrate body 11 side. The via lines are formed in the respective via holes 21x.

The wiring layer 22 is electrically connected to the signal electrodes 15 whose top end faces are exposed by the respective via holes 21x. For example, the material of the wiring layer 22 is a metal material containing copper (Cu) as the main component. For example, the thickness of the wiring patterns of the wiring layer 22 is set at about 10 to 20 µm. The wiring layer 22 may be electrically connected to the GND electrodes 13 or the power electrodes 14.

An insulating layer 23 is formed on the insulating layer 21 so as to cover the wiring layer 22. The insulating layer 23 is a solder resist layer. The insulating layer 23 has openings 23x which expose respective portions of the wiring layer 22. For example, the material of the insulating layer 23 is an epoxy or acrylic photosensitive resin composition. For example, the thickness of the insulating layer 23 is set at about 15 to 25 µm.

Those portions of the wiring layer 22 which are exposed by the respective openings 23x function as electrode pads to be electrically connected to a semiconductor chip (not shown).

In the following, these portions of the wiring layer 22 may be referred to as "electrode pads 22."

If necessary, for example, metal layers may be formed on the respective electrode pads 22 by electroless plating. Examples of each metal layer are an Au layer, an Ni/Au layer (i.e., a metal layer formed by laying an Ni layer and an Au layer in this order), and an Ni/Pd/Au layer (i.e., a metal layer formed by laying an Ni layer, a Pd layer, and an Au layer in this order).

External connection terminals such as solder balls or lead pins may further be formed on the respective electrode pads 22. The external connection terminals serve as terminals for electrical connection to a semiconductor chip (not shown). The electrode pads 22 themselves may be used as external connection terminals. For example, each electrode pad 22 has a circular plane shape and a diameter of about 40 to 120 μm. For example, the pitch of the electrode pads 42 is set at about 100 to 200 μm.

Likewise, an insulating layer 25, a wiring layer 26, and an insulating layer 27 are provided in this order on the other surface 11b of the substrate body 11 via the insulating layer 12. The wiring layer 26 is electrically connected to the signal electrodes 15 through respective via holes 25x. The wiring layer 26 may be electrically connected the GND electrodes 13 or the power electrodes 14. The insulating layer 25, the wiring layer 26, and the insulating layer 27 have the same structures as the insulating layer 21, the wiring layer 22, and the insulating layer 23, respectively, and hence will not be described in detail.

Those portions of the wiring layer 26 which are exposed by respective openings 27x function as electrode pads to be electrically connected to another wiring substrate or such a board as a mother board (not shown). In the following, these portions of the wiring layer 26 may be referred to as "electrode pads 26."

If necessary, for example, metal layers may be formed on the respective electrode pads 26. Examples of each metal layer are an Au layer, an Ni/Au layer (i.e., a metal layer formed by laying an Ni layer and an Au layer in this order), and an Ni/Pd/Au layer (i.e., a metal layer formed by laying an Ni layer, a Pd layer, and an Au layer in this order).

External connection terminals such as solder balls or lead pins may further be formed on the respective electrode pads 26. The external connection terminals serve as terminals for electrical connection to another wiring substrate or such a board as a mother board (not shown). The electrode pads 26 themselves may be used as external connection terminals.

For example, each electrode pad 26 has a circular plane shape and a diameter of about 200 to 1,000 μm. That is, the diameter of the electrode pads 26 which are to be electrically connected to another wiring substrate or such a board as a mother board is set larger than the diameter of the electrode pads 22 which are to be electrically connected to a semiconductor chip (not shown). For example, the pitch of the electrode pads 26 is set at about 500 to 1,200 μm. That is, the pitch of the electrode pads 26 which are to be electrically connected to another wiring substrate or such a board as a mother board is set larger than the diameter of the electrode pads 22 which are to be electrically connected to a semiconductor chip.

As described above, insulating layers and a wiring layer may be provided on both surfaces 11a and 11b of the substrate body 11.

<Example in Which Semiconductor Chips are Mounted>

Figure 8:
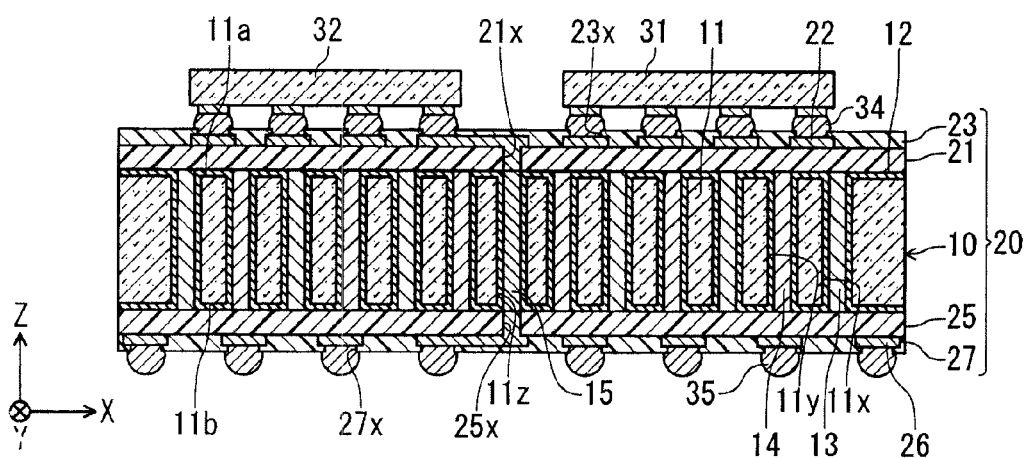
FIG. 8 is a sectional view of a semiconductor package in which semiconductor chips are mounted on the wiring substrate according to the first modification of the embodiment.

Next, an example semiconductor package in which semiconductor chips are mounted on the wiring substrate 20 will be described. FIG. 8 is a sectional view of a semiconductor package 30 in which semiconductor chips are mounted on the wiring substrate 20 according to the first modification of the embodiment. As shown in FIG. 8, the semiconductor package 30 is configured in such a manner that two semiconductor chips 31 and 32 are mounted on the side of the one surface 11a of the substrate body 11 of the wiring substrate 20.

The electrode pads 22 of the wiring substrate 20 are connected to the semiconductor chips 31 and 32 via respective joining portions 34. The spaces between the wiring substrate 20 and the semiconductor chips 31 and 32 may be filled with underfill resin. Joining portions 35 are formed on the respective electrode pads 26 of the wiring substrate 20. The joining portions 35 are portions to be electrically connected to another wiring substrate or such a board as a mother board (not shown). The joining portions 34 and 35 may be solder balls or the like. Example materials of the solder balls are an alloy containing Pb, an alloy of Sn and Cu, an alloy of Sn and Ag, and an alloy of Sn, Ag, and Cu.

In this manner, a semiconductor package is realized by mounting semiconductor chips on a wiring substrate. The number of semiconductor chips to be mounted on a wiring substrate may be one or a number that is larger than or equal to 3. Where plural semiconductor chips are mounted on a wiring substrate, they may be either ones having the same functions or ones having different functions.

Although the preferred embodiment and its modifications have been described, the invention is not limited to them. Various changes and replacements may be made in the above embodiment and modifications without departing from the scope as defined by the claims.

What is claimed is:

1. A wiring substrate comprising:
    a substrate body made of an inorganic material;
    a first electrode portion, having a rectangular plane shape, which penetrates through the substrate body in a thickness direction of the substrate body;
    a second electrode portion, having a rectangular plane shape, which penetrates through the substrate body in the thickness direction and faces the first electrode portion at a prescribed interval; and
    a signal electrode, which is provided between the first electrode portion and the second electrode portion and penetrates through the substrate body in the thickness direction,
    wherein:
    the first electrode portion is a ground electrode, and the second electrode portion is a power electrode;
    the first electrode portion includes a plurality of ground electrodes;
    the second electrode portion includes a plurality of power electrodes;
    the ground electrodes and the power electrodes are arranged alternately at prescribed intervals in each of an X direction and a Y direction which are perpendicular to each other;
    the signal electrode is interposed between one of the ground electrodes and one of the power electrodes which are opposed to each other; and
    the signal electrode has a circular plane shape.

2. The wiring substrate according to claim 1, wherein:
    end surfaces, exposed on a first surface of the substrate body, of the first electrode portion, the second electrode portion and the signal electrode are flush with the first surface; and
    end surfaces, exposed on a second surface of the substrate body, of the first electrode portion, the second electrode portion and the signal electrode are flush with the second surface.

3. The wiring substrate according to claim 1, wherein:
the signal electrode is disposed such that, in one of the X direction and the Y direction, among the plurality of ground electrodes and the plurality of power electrodes, one of the plurality of ground electrodes is disposed immediately adjacent to the signal electrode on a first side of the signal electrode in the one of the X direction and the Y direction, and one of the plurality of power electrodes is disposed immediately adjacent to the signal electrode on a second side of the signal electrode in the one of the X direction and the Y direction, the second side of the signal electrode being opposite to the first side of the signal electrode in the one of the X direction and the Y direction.

4. A semiconductor package comprising:
a wiring substrate comprising:
   a substrate body made of an inorganic material;
   a ground electrode, having a rectangular plane shape, which penetrates through the substrate body in a thickness direction of the substrate body;
   a power electrode, having a rectangular plane shape, which penetrates through the substrate body in the thickness direction and faces the ground electrode at a prescribed interval, wherein the ground electrode and the power electrode are arranged alternately in each of an X direction and a Y direction which are perpendicular to each other; and
   a signal electrode, which is interposed between the ground electrode and the power electrode which are opposed to each other, and penetrates through the substrate body in the thickness direction;
a semiconductor chip mounted on the wiring substrate; and
the signal electrode has a circular plane shape.

5. The semiconductor package according to claim 4, wherein:
the signal electrode is disposed such that, in one of the X direction and the Y direction, and among the ground electrode and the power electrode, the ground electrode is disposed immediately adjacent to the signal electrode on a first side of the signal electrode in the one of the X direction and the Y direction, and the power electrode is disposed immediately adjacent to the signal electrode on a second side of the signal electrode in the one of the X direction and the Y direction, the second side of the signal electrode being opposite to the first side of the signal electrode in the one of the X direction and the Y direction.

\* \* \* \* \*